United States Patent
Castro

(12) 
(10) Patent No.: US 6,300,165 B2
(45) Date of Patent: Oct. 9, 2001

(54) BALL GRID SUBSTRATE FOR LEAD-ON-CHIP SEMICONDUCTOR PACKAGE

(75) Inventor: Abram M. Castro, Fort Worth, TX (US)

(73) Assignee: Substrate Technologies Incorporated, Carrollton, TX (US)

( * ) Notice: Subject to any disclaimer, the term of this patent is extended or adjusted under 35 U.S.C. 154(b) by 0 days.

(21) Appl. No.: 09/765,004

(22) Filed: Jan. 18, 2001

Related U.S. Application Data

(62) Division of application No. 09/440,630, filed on Nov. 15, 1999.

(51) Int. Cl.⁷ ................................................. H01L 21/44
(52) U.S. Cl. ........................ 438/118; 438/122; 438/123; 438/124
(58) Field of Search ................................. 438/118, 121, 438/122, 123, 124, 667, FOR 381, FOR 384

(56) References Cited

U.S. PATENT DOCUMENTS

| | | | |
|---|---|---|---|
| 5,270,267 | * | 12/1993 | Quellet . |
| 5,677,566 | * | 10/1997 | King et al. . |
| 5,715,593 | * | 2/1998 | Kimura . |
| 5,785,538 | * | 7/1998 | Beaman et al. . |
| 5,821,605 | | 10/1998 | Hong et al. . |
| 5,863,805 | | 1/1999 | Chiang . |
| 5,879,964 | * | 6/1998 | Paik et al. . |
| 5,880,520 | | 3/1999 | Ma . |
| 5,900,582 | | 5/1999 | Tomita et al. . |
| 5,904,500 | * | 5/1999 | Tay . |
| 5,907,186 | | 5/1999 | Kang et al. . |
| 5,929,514 | | 7/1999 | Yalamanchili . |
| 5,933,708 | | 8/1999 | Sim et al. . |
| 5,951,804 | * | 9/1999 | Kweon et al. . |
| 5,998,865 | * | 12/1999 | Akram . |
| 6,013,109 | * | 1/2000 | Choi . |
| 6,013,535 | * | 1/2000 | Moden et al. . |
| 6,020,692 | * | 6/1998 | Farnworth et al. . |
| 6,028,356 | * | 2/2000 | Kimura . |
| 6,107,683 | * | 8/2000 | Castro et al. . |
| 6,127,833 | * | 1/1999 | Wu et al. . |
| 6,143,581 | * | 2/1999 | Johnson et al. . |
| 6,166,443 | * | 4/1999 | Ibana et al. . |
| 6,169,329 | * | 1/2001 | Farnworth et al. . |
| 6,204,093 | * | 2/2001 | Ahmad . |
| 6,210,992 | * | 8/1999 | Tandy et al. . |

FOREIGN PATENT DOCUMENTS

| | | | |
|---|---|---|---|
| 09213839-A | * | 8/1997 | (JP) . |
| 11274155-A | * | 3/1998 | (JP) . |
| 10107075-A | * | 4/1998 | (JP) . |

* cited by examiner

*Primary Examiner*—George Fourson
*Assistant Examiner*—Thanh V Pham
(74) *Attorney, Agent, or Firm*—Philip G. Meyers Intellectual Property Law, P.C.

(57) ABSTRACT

A package substrate suitable for use with a ball grid array according to the invention includes an electrically and thermally conductive heat sink having a top surface and a bottom surface, the heat sink having a slot formed therethrough which opens onto the top and bottom surfaces. A dielectric layer is formed on the bottom surface of the heat sink proximate the slot, preferably directly thereon without an intervening adhesive layer. A circuit is selectively formed in a circuit pattern on the dielectric layer. An electrically resistive soldermask is disposed on the dielectric layer and the circuit, which soldermask has openings therethrough which expose bond pads of the circuit. Such a substrate according to the invention permits the integrated circuit die to be mounted over the slot in the manner of a lead-on-chip package, but provides bond pads to which solder balls can be mounted in order to form a ball grid array.

19 Claims, 2 Drawing Sheets

BALL GRID SUBSTRATE FOR LEAD-ON-CHIP SEMICONDUCTOR PACKAGE

This application is a Div of Ser. No. 09/440,630 filed Nov. 15, 1999.

TECHNICAL FIELD

The present invention relates to an integrated circuit substrate and, more particularly, to a ball grid array package that accommodates a lead-on-chip architecture.

BACKGROUND OF THE INVENTION

An integrated circuit lead frame generally consists of a die paddle for mounting the integrated circuit (IC), leads that connect the integrated circuit to the package exterior, and a support structure that holds the frame together through the assembly operation. There are various configurations of lead frames currently in use in the semiconductor packaging industry including lead-on-chip (LOC) and lead-under-chip (LUC) configurations. These LOC packages have a unique mechanical configuration that, when assembled, best accommodate the needs of memory architecture.

Memory architecture is heavily influenced by the objective of providing an evenly distributed I/O channel (bus) across all the memory cells within the device. Desired characteristics driving this include lower operating voltages, which make the device more sensitive to voltage drops (spikes), higher gate densities, faster access times, and increased clock speeds (shorter paths). Thus, a large number of memory devices are typically designed with the I/O interface (aluminum bond pads) in a row bisecting the active side of the die. This centerline configuration provides minimized power, ground, and signal paths to every cell within the structure. LOC designed packages uniquely accommodate the I/O interface with a centerline bond configuration fanning out to perimeter leads.

A basic LOC package structure employs an etched or stamped lead frame that incorporates a centerline slot into a die paddle. The die paddle is connected to the leads and the frame via a tie bar that is eventually removed. During package assembly, the die is mounted against the die paddle with the active side (I/O side) down against the paddle base, leads on the opposite side. Package assemblers use a variety of die attachment methods, including tape and liquid adhesive. As the die is mounted, the I/O connections (aluminum bond pads) on the die are left exposed on the opposite side via the centerline slot. The bond pads are then electrically connected to the leads via conventional Au wire bond techniques. Once the device is wired, the structure can be overmolded or liquid encapsulated to protect the silicon and wires. The superstructure (frame and tie bars) can then be removed, if not removed already, and the devices are left singulated from the frame. The end configuration of the device can take numerous shapes based on lead frame technology used, but varieties include a small outline package (SOP), small outline integrated circuit (SOIC), plastic leaded chip carrier (PLCC) or a thin shrink small outline package (TSSOP). The lead frame technology and assembly techniques described are widely used within the industry.

Over the past five years, silicon trends have placed greater demands on the electrical, thermal, and reliability performance these LOC devices. One such trend relates to the gate densities now being achieved in the silicon itself. As device geometries decrease, the gate densities of memory devices have increased dramatically. Increased gate density translates into higher power concentration in smaller areas, which means more heat. Most LOC packages manage this heat by using a metal die pad, but the heat dissipation performance is reduced by the plastic encapsulant, a poor heat conductor, and the small surface area of the leads through which the heat is transmitted. Failure to properly manage the heat generated by the integrated circuit can result in an accelerated failure of the device circuitry.

A second trend stressing conventional LOC packaging is clock speed. The system's need for faster access times and greater bandwidth have driven memory clock speeds into the microprocessor realm of near and over 1 gigahertz. These clock speeds demand improved (lower) line inductance, power/ground networks, and shielding that plastic LOC packages cannot deliver due either to materials sets and/or lead configuration limitations. Finally, high-speed memory is permeating many high performance systems where the reliability of plastic (moisture absorbing) LOC packages comes into question.

Additionally, recent manufacturing trends have further compromised the effectiveness of traditional LOC packages. These tends involve the transition from traditional leaded integrated circuit packages to ball grid array (BGA) integrated circuit packages in a majority of high performance silicon applications. The main drivers of this trend include improved surface mountability, smaller package footprints, greater package densities, and growing assembly infrastuctures. A need has thus arisen for a new LOC substrate solution for high speed memory packaging that has the advantages of a BGA package and has enhanced thermal and electrical properties. These and other needs are satisfied by the ball grid array substrate package of the present invention.

SUMMARY OF THE INVENTION

A package substrate suitable for use with a ball grid array according to the invention includes an electrically and thermally conductive heat sink having a top surface and a bottom surface, the heat sink having a slot formed therethrough which opens onto the top and bottom surfaces. A dielectric layer is formed on the bottom surface of the heat sink proximate the slot, preferably directly thereon without an intervening adhesive layer. A circuit is selectively formed in a circuit pattern on the dielectric layer. An electrically resistive soldermask is disposed on the dielectric layer and the circuit, which soldermask has openings therethrough which expose bond pads of the circuit. Such a substrate according to the invention permits the integrated circuit die to be mounted over the slot in the manner of a lead-on-chip package, but provides bond pads to which solder balls can be mounted in order to form a ball grid array. A layer of an adhesive, such as in a tape form, may be cut to size and secured to the top surface of the heat sink proximate the slot, eliminating the need for the user to apply the adhesive during the process of mounting the die.

According to preferred embodiments of the invention, the substrate includes one or more vias filled with electrically and thermally conductive material, which vias extend through the dielectric layer and accessible through the soldermask layer, and are typically located outside of the circuit pattern. Solder balls may be connected to these filled vias in order to permit grounding of the heat sink to the motherboard and permit heat from the integrated circuit die to pass through the heat sink and via to the motherboard. In addition, a portion of the bottom surface of the heat sink adjacent the slot may be left exposed, such as by selective removal of the dielectric coating, for connection to a ground wire connected to the die. Such a ground wire can pass heat directly from the die to the heat sink, after which it can pass through the filled via into the motherboard.

A new lead frame, or "ball frame" according to the invention captures the assembly advantages of LOC type packages and addresses the shortcomings described above. The lead fame is improved by incorporation of a dielectric and circuit layer on the side opposite the die. This configuration can provide thermal management, active power and ground networks, and a ball grid array pin-out, while accommodating existing and foreseeable die sizes. Such a lead frame of the invention preferably comprises a strip of package substrates as described above formed side by side and connected on the ends by rails. Each package substrate may be separated from each adjacent package substrate by an elongated widthwise slot having a greater length than the slot in the heat sink. The strip is cut both vertically and horizontally at the time of use to yield separate package substrates.

The invention further provides a method for manufacturing a substrate package. According to this method, the bottom surface of the heat sink is first treated with an adhesion promoter, and the dielectric layer is then formed directly on the treated bottom surface. A circuit pattern is then formed on the dielectric layer, preferably by electrolytic deposition. An electrically resistive soldermask is then formed over the dielectric layer and circuit, and portions of the soldermask are then selectively removed to expose wire bonding pads and ball pads on the circuit. Optionally, a via may be formed through the dielectric layer and filled with an electrically and thermally conductive material, and a further portion of the soldermask is selectively removed to expose and permit access to the filled via. A slot is formed in the heat sink at a location adjacent the wire bonding pads, which slot opens onto top and bottom surfaces of the heat sink. Optionally, the adhesive layer for attaching the die may be pre-applied by cutting an adhesive sheet into a preform which has an opening therein of the same shape as the slot, and applying the preform to the top surface of the heat sink so that the preform opening is in alignment with the slot. The substrate may then be shipped to an end user for completion. If a ground wire is to be run from the die directly to the heat sink as described above, then the process further includes a step of exposing an edge of the bottom surface of the heat sink adjacent the slot. The foregoing steps are preferably performed on a series of substrates in strip form in order to produce a lead frame according to the invention.

The end user completes the integrated circuit package using a package substrate made by the foregoing process. If not already present, an adhesive is applied to the top surface of the heat sink around the slot, and an integrated circuit die is mounted to the top surface of the heat sink by means of the adhesive, such that wire bond pads on the die are exposed in the slot. Electrically conductive wires are bonded to the wire bond pads on the die and to the wire bond pads of the circuit adjacent the slot. The wires and die are then covered with an encapsulant, and solder balls are bonded (soldered) to the ball pads. The integrated circuit packages by then be singulated by cutting the lead frame as mentioned above. These and other aspects of the invention are described further in the detailed description that follows.

BRIEF DESCRIPTION OF THE DRAWINGS

A more complete understanding of the invention may be had by reference to the following detailed description when taken in conjunction with the accompanying drawings, wherein.

DETAILED DESCRIPTION

Figure 1:
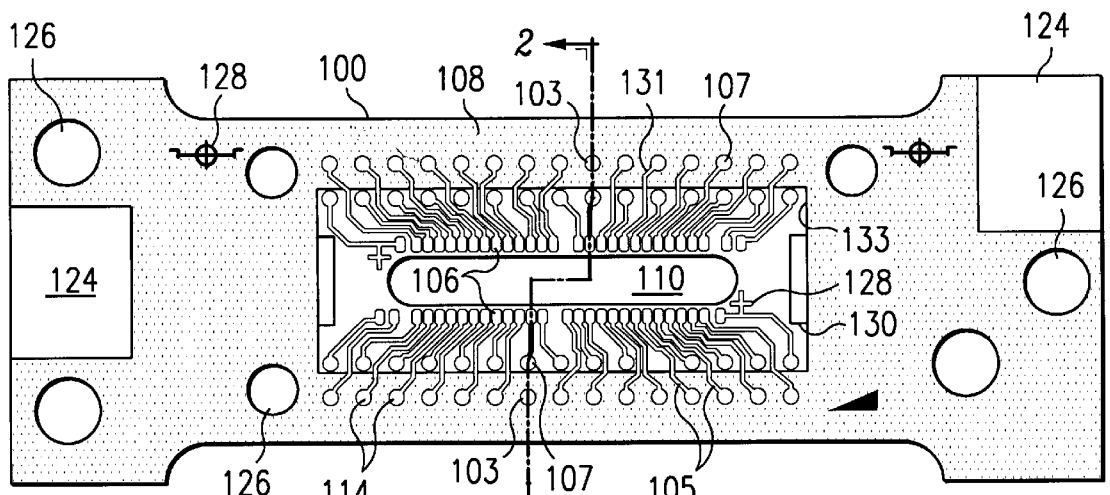
FIG. 1 is a top view of an integrated circuit package substrate according to the invention.
Figure 2:
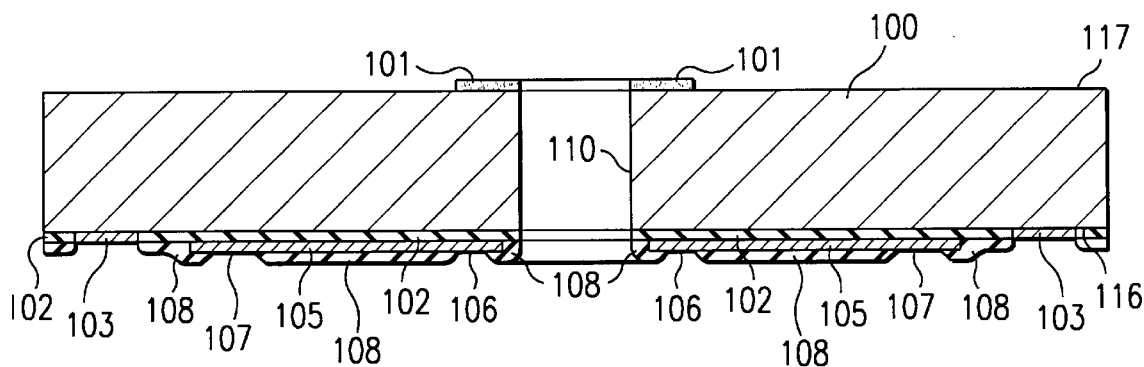
FIG. 2 is a cross-sectional view along the line 2—2 in FIG. 1.

Referring to FIGS. 1 and 2, an integrated circuit package substrate of the invention includes a thermally conductive paddle or heat sink 100 that serves as a package platform. Heat sink 100 has a bottom face or surface 116 and a top face or surface 117. An adhesive layer 101 is adhered to top surface 117 adjacent a widthwise slot 110 which opens onto surfaces 116, 117. A dielectric layer 102 is formed directly onto bottom surface 116 (i.e., without any intervening adhesive layer) which has been treated to promote adhesion of the dielectric 102 as described hereafter. A circuit pattern 105 is formed on the dielectric 102 and covered by a soldermask layer 108. Micro-vias 103 filled with copper or a similar metal extend through dielectric 102 and are accessible through openings in soldermask 108. Two rows of electrically conductive wire bond pads 106 are formed adjacent slot 110, either adjacent thereto as shown, or spaced therefrom by the width of exposed edge 104 as described hereafter. Circuit pattern 105 spans pads 106 and a series of terminal (ball) pads 107, which are left exposed through soldermask 108 so that solder balls can later be attached thereto.

A method of making an integrated circuit package substrate according to the invention includes the initial step of treating bottom surface 116 of heat sink 100 with an adhesion promoter, generally one that roughens or oxidizes bottom surface 116 of heat sink 100, so that a dielectric layer 102 can be formed directly thereon without the use of an intervening adhesive. The dielectric, generally in liquid form, is then applied to bottom surface 116 to form a curable dielectric layer. A circuit 105 is electrolytically and selectively formed on dielectric 108 in the first of one or more circuit patterns, and electrically resistive soldermask 108 is formed on and covers dielectric layer 102 and circuit 105. For reliability purposes, soldermask 108 preferably has a high epoxy content. Soldermask 108 has openings formed therein which expose bond areas 106, 107 of the circuits 105. Such openings may be formed by the known process of coating the soldermask layer, imaging through a photomask, and then removing the uncured areas which correspond to the locations of inner wire bond pads 106 and outer solder ball pads 107.

Vias 103 are formed during the sequential build process and are filled (plated) with a thermally conductive and electrically material such as copper, so that heat may be conducted directly from heat sink 100 through the metal in via 103 without an intervening adhesive layer. During the circuitization process, a copper layer is deposited on the dielectric layer and into micro-vias 103, and then etched into the desired circuit pattern 105, and for this reason the heat conductive metal deposited in vias 103 is preferably the same as the metal used to form circuit 105. To accommodate the subsequent wire bond interconnect, circuit 105 preferably positions wire bond pads 106 at or near centerline slot 110. Except as otherwise described herein, the process of circuitization and build-up of dielectric layer 102, circuit 105, vias 103 and soldermask 108 proceeds as described in commonly-assigned U.S. Ser. No. 09/075,286, filed May 8, 1998, and also as PCT Publication WO 98/59368, published Dec. 30, 1998, the entire contents of which applications are incorporated herein by reference for all purposes.

A rectangular layer of copper 130 is formed at the same time as circuit 105. Layer 130 is positioned to be centered on slot 110, and is spaced from the edges of each circuit 105. Areas 131 of layer 130 between circuits 105 serve to isolate the circuits 105 from interfering electrically with each other near slot 100 where the circuit density is greatest. A pair of centered, rectangular end portions 133 may be left uncovered by soldermask 108 to serve as ground connections.

Figure 5:
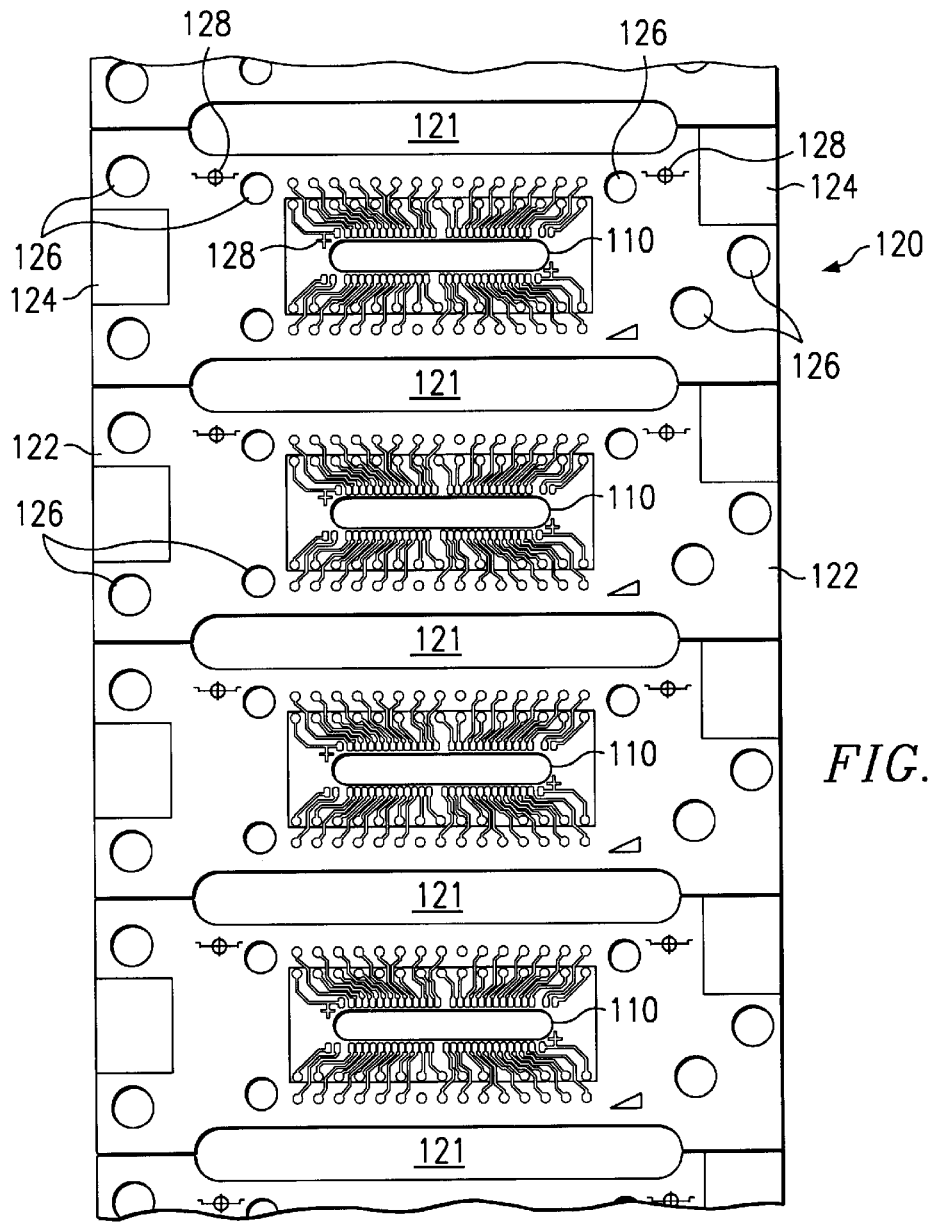
FIG. 5 is a top view of a lead frame strip according to the invention.

Widthwise slot 110 is then formed through the coated substrate in a trimming operation. Slot 110 is formed between left and right rows of bond areas 106 so that bond areas 106 adjoin opposite side edges of slot 110. At the same time, if a number of substrates are being formed as a strip 120 as shown in FIG. 5, then identical widthwise slots 110 are formed at regular intervals along strip 120, alternating with widthwise slots 121 greater in length than slots 110. Slots 121 separate the sides of one substrate from adjacent ones, but the strip remains united by a pair of end pieces or rails 122 which run the length of strip 120. Tooling holes 126 are formed to aid in subsequent processing, together with alignment fiducials 128. At this stage, strip 120 may be shipped to its destination, but preferably layer 101 of an adhesive is first applied to top surface 117 of heat sink 100 adjacent slot 110 and covered with a removable liner.

Figure 3:
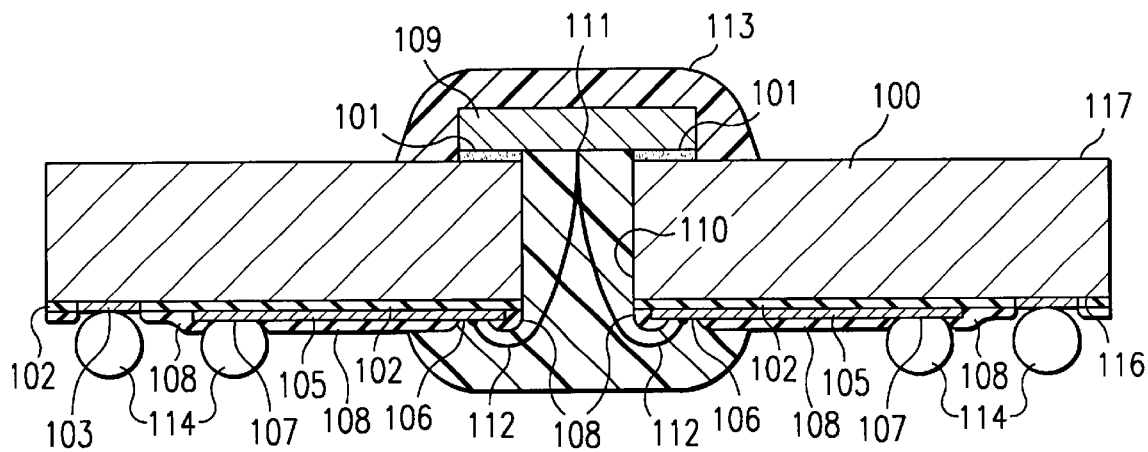
FIG. 3 is a cross-sectional view of a completed integrated circuit package according to the invention.

Referring to FIG. 3, strip 120 of the invention is then further processed by the user to make an integrated circuit package according to the invention. Integrated circuit die 109 is attached to top surface 117 of heat sink 100 over slot 110 and secured thereto by the adhesive layer 101. If the adhesive was pre-applied prior to shipping, then an adhesive release liner, if used, is removed. Wires 112 are then bonded between exposed bonding pads 111 on die 109 and wire bonding pads 106 formed near slot 110, generally in two widthwise rows along opposite sides of slot 110. Centerline slot 110 allows for easy access to aluminum wire bond pads 111 on the active side of die 109. Conventional wire bonding techniques allow for electrical connection of die 109 to the circuitized wire bond pads 106 by wires 112 made of an electrically conductive metal such as gold.

Figure 4:
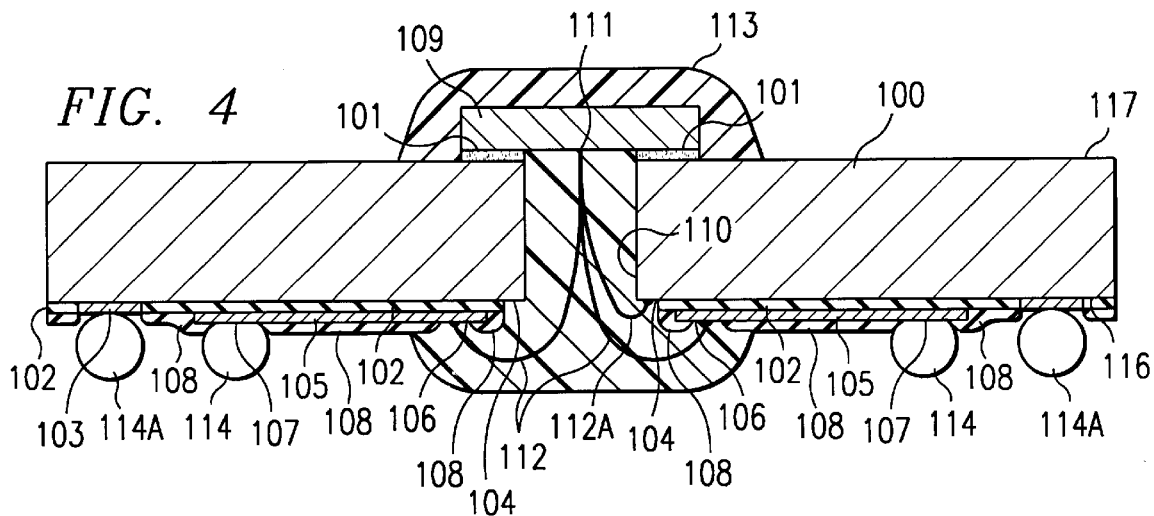
FIG. 4 is a cross-sectional view similar to FIG. 2 of an alternative embodiment of the invention.

Optionally, if tie dielectric 108 is removed from bottom surface 116 along one or preferably both edges of slot 110 as shown in FIG. 4, then one or more wires 112A may be run from a grounding pad on die 109 to the exposed edge 104 of heat sink 100 and bonded thereto, providing additional heat dissipation for the integrated circuit as well as electrical grounding. Exposed edge 104 is formed by selective removal of dielectric 108 from bottom surface 116 along the length of one or preferably both of the widthwise edges of slot 110, and preferably has a width of up to about 0.02 inch.

Wires 112, 112A are then encapsulated in an electrically resistive plastic material in a manner known in the art, such as by liquid encapsulation. However, since encapsulant 113 must be placed on both sides of heat sink 100 as shown in FIG. 2, it is preferred to form encapsulant 113 by transfer molding in a manner known in the art. Exposed copper end portions 124 on rails 122 act as gates for the molding process. After encapsulation, a standard ball attach process is used to attach solder balls 114 to the provided ball pads 107 in order to provide the electrical and thermal path to the package perimeter. Solder balls 114 are soldered onto exposed ball pads 107 of the circuit 105 so that a ball grid array is formed, preferably as two or more parallel, widthwise rows with at least two such rows on opposite sides of slot 110. Additional solder balls 114A which are isolated from circuit 105 are bonded to conductive vias 103 to provide for thermal management. Balls 114A permit heat from the integrated circuit to be conducted from heat sink 100, through copper-filled vias 103 to the motherboard on which the integrated circuit package is mounted.

Upon assembly completion, the individual units are singulated from the frame by conventional trim and form techniques. Strip 120 is subject to a final cutting operation in which rails 122 are removed, and individual packaged integrated circuits are ready for use. Delivering numerous ball frame packages in-line (as a strip 120) according to current industry handling preferences provides a lead frame of the invention ideally suited for automated assembly. The pattern to which the ball grid circuitry is laid out can accommodate conventional industry footprints (Jedec) and pitch, or be customized for application-specific requirements. The foregoing method can produce a chip-scale package or a near chip-scale package (wherein the package is no more than 200% of the length and 200% the width of the die) with advanced thermal management features.

A lead frame such as strip 120 of the invention as described above preferably incorporates a thermally conductive heat sink providing a die paddle on one side and a built-up circuit on the opposite side. The die 109 attached to the frame by adhesive 101 is wire bonded through slot 110 to the circuit side. Circuit paths 105 route the signals electrically to a ball grid array pin out.

With reference to FIG. 4, additional heat can pass through ground wire 112A directly to heat sink 100. Some heat is dissipated directly through the dielectric layer 102 and into ambient air below the package, but the high thermal efficiency of the plated copper in via(s) 103 provides the most direct path out of the package. Incorporating more ball pads into this ground/thermal network can increase the thermal performance of the package. Current electrical/thermal software modeling techniques can provide an optimized netlist or circuit path layout to accommodate performance requirements.

Since dielectric 102 is applied to the circuit side without the use of adhesives, and because dielectric 102 can then be defined to access heat sink 100 where desirable, i.e., at vias 103, numerous electrical advantages can be achieved. These include using heat sink 100 as a ground (reference) plane. Replacement of leads with solder balls decreases thermal resistance, reduces line inductance, and decreases package footprint. The addition of more dielectric layers permits higher layer counts when required, for example, where there are several circuits built on one another. The assembly of the new ball frame substrate of the invention is entirely suited to the assembly of standard LOC type packages. The ball attach process replaces the lead trim and form operation.

Optional adhesive layer 101 can be supplied on the frame to top surface 117 and pre-loaded in a "b-stage" format. This option preferably makes use of die bonding sheet type materials produced by companies such as Nippon Steel Chemical. Adhesive 101 may include a thermal conductivity enhancement agent such as a particulate silver filler to aid in transmission of heat from die 109. The die bonding sheet can be cut into a preform that matches the die size and centerline slot configuration of the substrate and can be tack attached in a simple, low cost operation to form adhesive layer 101. The incorporation of the adhesive onto the lead frame or strip 120 simplifies the assembly process for the assembly house, but can be omitted in favor of traditional die attach procedures used on a ball frame delivered without the optional adhesive attached.

On bottom surface 116, dielectric layer 102 acts as an electrically isolating layer between heat sink 100 and ball grid circuit pattern 105. Since dielectric layer 102 is definable by means of photolithography, laser etching, plasma etching, or other techniques prior to cure, and as there are no chemical adhesives used between dielectric layer 102 and heat sink 100, heat sink 100 can be accessed by the formation of micro-vias 103 and edges 104 as shown in FIG. 4.

Heat sink 100 is preferably made of a copper alloy such as Olin Metal & Brass Copper Alloy 194. This material is 98% copper, which is very low cost, with very high thermal conductivity. The other 2% consists of metallic fillers (Pb, Zn) that help increase mechanical properties (tensile strength, elongation) and consequently make heat sink 100 less susceptible to handling problems. Heat sink 100 can be thinner than prior BGA cores, preferably having a thickness from 250–300 microns, because the dies for use with the substrate of the present invention are smaller, and the heat sink is not required to have as much mechanical stiffness. Heat sink 100 could also be made of aluminum or be a copper-clad laminate of the type presently in commercial use.

Because the leads and lead spacing required in traditional LOC packages can be eliminated in a package according to the invention, the area of the die pad can be increased while the package footprint (length and width) is reduced. This advantage is further realized by improved thermal performance (heat dissipation as described above) in a smaller area. As package solder balls 114 replace the leads used in known LOC packages, the thermal path into the motherboard is reduced in length while the thermal mass that conducts heat, which is related to solder ball volume, is increased. This translates into a very effective heat sink for the integrated circuit. The effectiveness of this heat sink can be further improved by designing the package for a near chip scale or slightly larger than integrated circuit configuration. In such a configuration, the die paddle on which the integrated circuit sits is large enough to both provide a platform for mold encapsulation and the maximum surface area for thermal transmission, but small enough to minimize package footprint per Jedec or custom requirements.

Electrical advantages of the ball frame package of the invention stem form the use of a photodielectric optimized for high speed performance. Such dielectrics are now commercially available from electronics materials suppliers including Shipley, Nippon Steel Chemical, and Ciba Giegy. The first advantage of using a photo-definable dielectric relates to its ability to ground the heat sink. As mentioned, the dielectric is applied without the use of adhesives, so there exists no interposing layer between the dielectric and heat sink. By designing vias into the dielectric in selected ground "nets", and by plating these vias with an electrically as well as thermally conductive material like copper, the heat sink can be easily accessed as a ground, or return path for the circuitry. The thin nature of the dielectric, ideally applied to a thickness between 25 and 50 microns, further shortens this return. This is of benefit to designers using differential pair circuit design techniques for high speed applications.

A further electrical advantage of the ball frame package of the invention relates to the dielectric constant of the materials used. The photo-definable dielectric preferably contains minimal amounts of filler components, and ideally has a dielectric constant of below 3.5. This allows for reduced capacitance in the insulating material that is critical for high-speed circuitry.

The ball frame configuration of the invention as a ball grid array package allows shorter line lengths when compared to lead frame, and consequently less signal loss and line inductance. Additional electrical benefits can be obtained from the elimination of bus line antennae when plating the structure with wire-bondable nickel/gold. Additional power planes (circuits 105) can be obtained in the structure through use of the build-up circuitization techniques in which the process of applying dielectric and circuit layers to the frame is repeated until the design requirements are satisfied. Finally, designers can benefit from the fine geometries achieved thru the build-up circuitization process, which allow significant improvements in I/O routability for a high speed integrated circuit die.

An added benefit of the ball frame configuration of the invention is the low cost manufacturing process associated with the technology. Current lead frame technology is based on a reel-to-reel image/etch process in dedicated lead frame factories. This technology is widely used and well understood in the industry. In production, these techniques allow for low cost volume production frames, but are difficult to re-tool for new designs, and are capital intensive to set up. Ball frame technology is based on panel processing very similar to that employed by printed circuit board shops. Frames are processed in panel or strip format that are typically run in batches on standard equipment sets. At the end of the process, the frames are singulated from the panel through conventional printed wiring board milling or stamping techniques. This process allows for lower tooling costs and flexibility in manufacturing equipment. The use of a low cost dielectric system directly applied to the panel eliminates the need for costly adhesive and lamination processes associated with alternate LOC technologies that employ tape or laminate printed wiring boards in conjunction with a heat sink. Yield enhancements are achieved with the streamlined process flow associated with the build up circuitization technique.

The ball frame system of the invention can be adopted or delivered to suit applications beyond LOC configurations. These include integrated circuits designed for power management, such as hard disk drive controllers, LCD controllers, low level logic and control, or even identification applications. Regardless of the lead frame technology being replaced, applying a photo- or laser-definable dielectric to a heat sink and the delivery of the heat sink in a lead frame format with a ball grid configuration allows for numerous design and package circuitry advantages.

While the present invention has been described with reference to the illustrated embodiment, it is not intended to limit the invention but, on the contrary, it is intended to cover such alternatives, modifications and equivalents as may be included in the spirit and scope of the invention. For example, instead of solder balls, the motherboard may be provided with pins or projections which are bought into contact with the conductive pads on the integrated circuit package. These and other modifications involving, for example, reversal of parts, are within the scope of the claims which follow.

What is claimed is:

1. A method for manufacturing a substrate package, comprising the steps of:

treating a bottom surface of a heat sink with an adhesion promoter;

forming a dielectric layer directly on the treated bottom surface of the heat sink;

forming a circuit pattern on the dielectric layer;

forming an electrically resistive soldermask over the dielectric layer and circuit;

exposing wire bonding pads and ball pads on the circuit by selectively removing portions of the soldermask; and forming a widthwise slot through the heat sink at a location adjacent the wire bonding pads, which slot opens onto top and bottom surfaces of the heat sink.

2. The method of claim 1, further comprising:

cutting an adhesive sheet into a preform which has an opening therein of the same shape as the slot; and applying the preform to the top surface of the heat sink so that the preform opening is in alignment wit the slot.

3. The method of claim 2, further conprising shipping the substrate package to an end user.

4. The method of claim 1, further comprising exposing an edge of the bottom surface of the heat sink adjacent the slot.

5. The method of claim 1, further comprising:

applying an adhesive to the top surface of the heat sink around the slot;

mounting an integrated circuit die to the top surface of the heat sink by means of the adhesive, such that wire bond pads on the die are exposed in the slot;

bonding electrically conductive wires to the wire bond pads on the die and to the wire bond pads of the circuit adjacent the slot;

covering the wires and the die with an encapsulant; and bonding solder balls to the ball pads.

6. The method of claim 1, further comprising:

forming a via through the dielectric layer;

filling the via with a heat conducting material; and forming an access opening through the soldermask over the filled via.

7. The method of claim 1, further comprising:

forming a via through the dielectric layer;

filling the via with a heat conducting material;

forming an access opening through the soldermask over the filled via;

applying an adhesive to the top surface of the heat sink around the slot;

mounting an integrated circuit die to the top surface of the heat sink by means of the adhesive, such that wire bond pads on the die are exposed in the slot;

bonding electrically conductive wires to the wire bond pads on the die and to the wire bond pads of the circuit adjacent the slot;

covering the wires and the die with an encapsulant;

bonding solder balls to the ball pads; and bonding solder balls to the filled heat conductive via.

8. The method of claim 4, further comprising:

applying an adhesive to the top surface of the heat sink around the slot;

mounting an integrated circuit die to the top surface of the heat sink by means of the adhesive, such that wire bond pads on the die are exposed in the slot;

bonding electrically conductive wires to the wire bond pads on the die and to the wire bond pads of the circuit adjacent the slot;

bonding an electrically conductive wire to a ground wire bond pad on the die and to the exposed edge on the bottom surface of the heat sink adjacent the slot;

covering the wires and the die with an encapsulant; and bonding solder balls to the ball pads.

9. The method of claim 6, wherein the circuit pattern is formed from a conductive metal, comprising filling the via during the step of forming a circuit pattern on the dielectric layer with the same metal used to form the circuit pattern.

10. A method for manufacturing a substrate package, comprising the steps of:

treating a bottom surface of a heat sink with an adhesion promoter;

forming a dielectric layer directly on the treated bottom surface of the heat sink;

forming a circuit pattern on the dielectric layer;

forming an electrically resistive soldermask over the circuit;

exposing wire bonding pads and ball pads on the circuit by removing portions of the soldermask;

forming a slot through the heat sink adjacent the wire bonding pads, which slot opens onto top and bottom surfaces of the heat sink; and forming a via through the dielectric layer.

11. The process of claim 10 further comprising filling the via with a heat conducting material.

12. The method of claim 11, further comprising:

cutting an adhesive sheet into a preform which has an opening therein of the same shape as the slot; and applying the preform to the top surface of the heat sink so that the preform opening is in alignment with the slot.

13. The method of claim 11, further comprising exposing an edge of the bottom surface of the heat sink adjacent the slot.

14. The method of claim 11, further comprising:

applying an adhesive to the top surface of the heat sink around the slot;

mounting an integrated circuit die to the top surface of the heat sink by means of the adhesive, such that wire bond pads on the die are exposed in the slot;

bonding electrically conductive wires to the wire bond pads on the die and to the wire bond pads of the circuit adjacent the slot;

covering the wires and the die with an encapsulant; and bonding solder balls to the ball pads.

15. The method of claim 11, further comprising:

forming an access opening through the soldermask over the filled via.

16. A method for manufacturing a substrate package, comprising the steps of:

forming a dielectric layer directly on a bottom surface of a heat sink;

forming a circuit pattern on the dielectric layer;

forming an electrically resistive soldermask over the circuit;

exposing wire bonding pads and ball pads on the circuit by removing portions of the soldermask;

forming a slot through the heat sink adjacent the wire bonding pads, which slot opens onto top and bottom surfaces of the heat sink;

forming a via through the dielectric layer;

forming an opening through the soldermask adjacent the via;

mounting an integrated circuit die to the top surface of the heat sink by means of an adhesive, such that wire bond pads on the die are exposed in the slot; and bonding electrically conductive wires to the wire bond pads on the die and to the wire bond pads of the circuit adjacent the slot.

17. The method of claim 16 further comprising:

covering the wires and the die with an encapsulant;

bonding solder balls to the ball pads; and bonding solder balls to the filled heat conductive via.

18. The method of claim 17, further comprising:

applying an adhesive to the top surface of the heat sink around the slot;

mounting an integrated circuit die to the top surface of the heat sink by means of the adhesive, such that wire bond pads on the die are exposed in the slot;

bonding electrically conductive wires to the wire bond pads on the die and to the wire bond pads of the circuit adjacent the slot;

bonding an electrically conductive wire to a ground wire bond pad on the die and to the exposed edge on the bottom surface of the heat sink adjacent the slot;

covering the wires and the die with an encapsulant; and bonding solder balls to the ball pads.

19. The method of claim 18, further comprising shipping the substrate package to an end user.

* * * * *